United States Patent
Vitta et al.

(10) Patent No.: US 7,095,056 B2
(45) Date of Patent: Aug. 22, 2006

(54) WHITE LIGHT EMITTING DEVICE AND METHOD

(75) Inventors: Pranciškus Vitta, Vilnius (LT);
Arturas Zukauskas, Vilnius (LT);
Remigijus Gaska, Columbia, SC (US);
Michael Shur, Latham, NY (US)

(73) Assignee: Sensor Electronic Technology, Inc., Columbus, SC (US)

( * ) Notice: Subject to any disclaimer, the term of this patent is extended or adjusted under 35 U.S.C. 154(b) by 0 days.

(21) Appl. No.: 11/001,304

(22) Filed: Dec. 1, 2004

(65) Prior Publication Data
US 2005/0127381 A1 Jun. 16, 2005

Related U.S. Application Data

(60) Provisional application No. 60/528,380, filed on Dec. 10, 2003.

(51) Int. Cl.
*H01L 29/20* (2006.01)
(52) U.S. Cl. ............................. 257/89; 257/88
(58) Field of Classification Search .................. 257/88, 257/89, 98; 313/501–504, 485–487; 315/291, 315/179, 150; 327/514, 515
See application file for complete search history.

(56) References Cited

U.S. PATENT DOCUMENTS 6,498,440 B1 * 12/2002 Stam et al. ................. 315/291
6,636,003 B1 * 10/2003 Rahm et al. ................ 315/179

FOREIGN PATENT DOCUMENTS

WO WO2004/011846 A1 2/2004

OTHER PUBLICATIONS

Mueller-Mach, R. et al., "High-Power Phosphor-Converted Light-Emitting Diodes Based on III-Nitrides," IEEE J on Sel. Topics/Quant. Elec., V. 8, N. 2, Mar./Apr. 2002, pp. 339-345.
Mueller-Mach, R. et al., "White Light Emitting Diodes for Illumination," Proceedings of SPIE, vol. 3938, 2000, pp. 30-41.
Muthu, S. et al., "Red, Green, and Blue LEDs for White Light Illumination," IEEE J. on Sel. Topics in Quantum Elec., V. 8, N. 2, Mar./Apr. 2002, pp. 333-338.
Nishida, T. et al., "High-Color-Rendering Light Sources Consisting of a 350-nm Ultraviolet Light-Emitting Diode and . . . ," Ap. Phys. Ltrs., V. 82, N. 22, 2003, pp. 3817-3819.
Schlotter, P. et al., "Luminescence Conversion of Blue Light Emitting Diodes," Appl. Physics A 64, 1997, pp. 417-418.
Shibata, N. et al., "Fabrication of LED Based on III-V Nitride and Its Applications," Phys. Stat. Sol. (a) 200, No. 1, 2003, pp. 58-61.

(Continued)

*Primary Examiner*—Minhloan Tran
*Assistant Examiner*—Benjamin Tzu-Hung Liu
(74) *Attorney, Agent, or Firm*—John W. LaBatt; Hoffman, Warnick & D'Alessandro LLC

(57) ABSTRACT

A white light emitting device and method that generate light by combining light produced by a white light source with light produced by at least one supplemental light emitting diode (LED). The supplemental light can be used to adjust one or more properties of the generated light. Adjustments can be made to the generated light based on feedback.

20 Claims, 5 Drawing Sheets

OTHER PUBLICATIONS

Zukauskas, A. et al., "Optimization of White Polychromatic Semiconductor Lamps," Applied Phys. Ltrs., vol. 80, No. 2, Jan. 14, 2002, pp. 234-236.

Zukauskas, A. et al., "Quadrichromatic White Solid-State Lamp with Digital Feedback," Proc. SPIE vol. 518, 2004, pp. 185-198.

CIE, "Method of Measuring and Specifying Colour Rendering Properties of Light Sources," Pub. No. 13.3, 1995 available at http://www.hike.te.chiba-u.jp/ikeda/CIE.

Zukauskas, A. et al., "Introduction to Solid-State Lighting," New York, Wiley, 2002, pp. 117-132.

Nakamura S. et al., "The Blue Laser Diode: GaN Based Light Emitters and Lasers," Springer, 1997, pp. 217-221.

"Lumileds—Light from Silicon Valley," printed from http://www.luxeon.com, date unknown.

Bowers B., "Lengthening the Day: A History of Lighting Technology," Oxford University Press, 1998, p. 118.

* cited by examiner

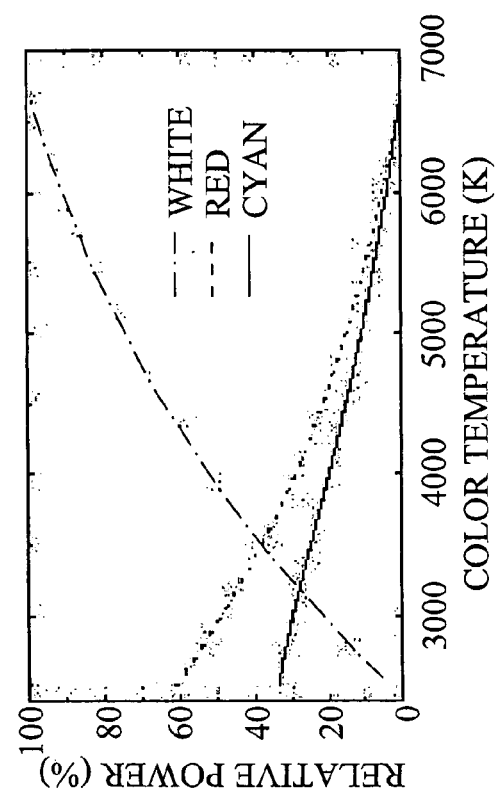
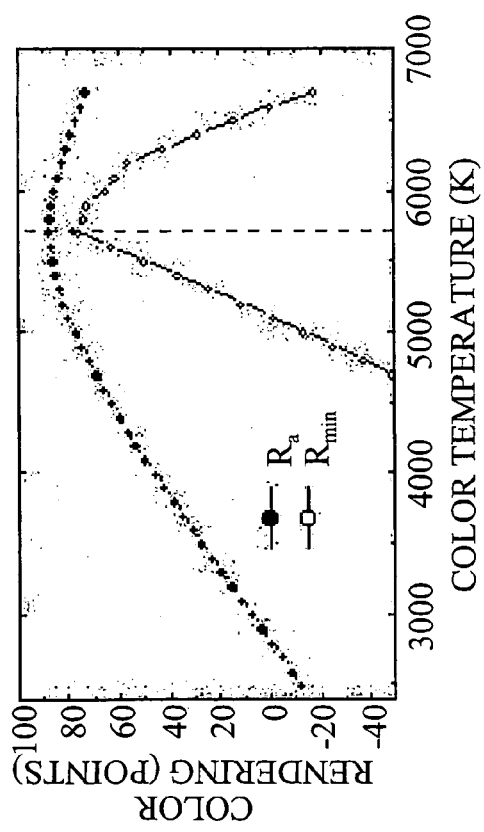
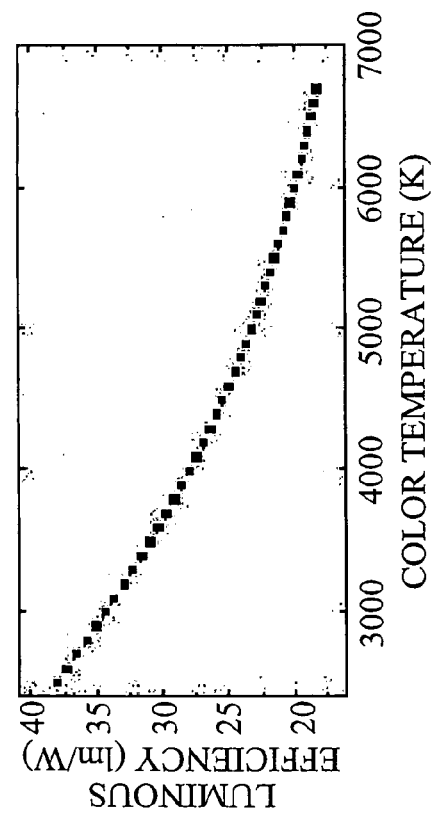
FIG. 4C
FIG. 4A
FIG. 4B

WHITE LIGHT EMITTING DEVICE AND METHOD

REFERENCE TO PRIOR APPLICATION

The current application claims the benefit of U.S. Provisional Application No. 60/528,380, filed on Dec. 10, 2003, which is hereby incorporated herein by reference.

BACKGROUND OF THE INVENTION

1. Technical Field

The invention relates generally to devices for emitting white light, and more specifically, to a device that can generate white light having one or more alterable and/or selectable properties.

2. Related Art

Traditionally, the general illumination market has comprised lighting devices such as incandescent bulbs and mercury-containing discharge tubes. In general, different lighting needs can be served by different bulbs. For example, general outdoor lighting can use lower cost bulbs that provide lower color rendering, while store lighting generally requires a high color rendering. However, most general illumination applications require some form of white light.

Recently, light emitting diodes (LEDs) have started to be used in high-power devices, and are no longer limited to uses such as small indicator lamps. Further, LEDs are generally more energy efficient than the lighting devices traditionally used in the general illumination market. As a result, LEDs are considered an attractive alternative to traditional general lighting devices, and are encroaching on applications in the general illumination market.

However, LEDs are inherently chromatic (e.g., non-white) sources of light. In general, two solutions have been used to generate white light using one or more LEDs. In one solution, a single chip partially converts blue light or completely converts near-ultraviolet light emitted by an LED to light emitted over a broad spectrum (e.g., white light) through the use of an ionic phosphor layer. For example, an LED can emit blue light, some of which is converted to yellow light by a phosphor layer and some of which escapes unchanged. As a result, the device emits white light that is a dichromatic combination of yellow-blue (YB) light. Alternatively, a multi-phosphor blend can be used to generate light in multiple chromatics such as tri-chromatic red-green-blue (RGB) light. Advanced phosphor-conversion LEDs that exploit multi-phosphor blends exhibit excellent color rendering properties and are available for a variety of color temperatures.

However, phosphor-conversion white LEDs also have some drawbacks. For example, energy is expended during the conversion process, making the device less efficient. Further, different temperature behavior and different rates of deterioration of the phosphors and the semiconductor chip result in an uncontrollable shift in chromaticity that makes the lifetime during which the device can generate acceptable white light shorter than the lifetime of the device itself.

In an alternative solution, light emitted from multiple LEDs having varying chromaticity can be mixed to generate white light. Despite a relatively narrow emission spectra of each LED, polychromatic color mixing devices that incorporate four or more primary sources can cover the entire visible spectrum and accurately render the colors of illuminated objects. For example, an optimized quadri-chromatic red-amber-green-blue (RAGB) device has been shown to feature high values of both the general and all the special color rendering indices.

Further, these devices can operate more efficiently than the phosphor-conversion white LEDs since there is no energy loss due to conversion. In addition, these devices allow for full color control, an ability to tradeoff between qualitative characteristics (e.g., efficiency) and quantitative characteristics (e.g., color rendering), incorporation of internal feedback for compensation of chromaticity variations due to aging, temperature, etc., and the like. However, further development of the multi-chip lighting devices is substantially hindered by the absence of efficient LEDs in the yellow-green region due to various issues with semiconductor band-structure and material.

As a result, a need exists for an improved method and device for generating white light. In particular, a need exists for a method and device that supplement a white light source, such as a phosphor-conversion white LED, with one or more supplemental LEDs. In this manner, one or more properties of the white light can be adjusted to extend the life of the device and/or based on an application for the device.

SUMMARY OF THE INVENTION

The invention provides a method and device for generating white light. In particular, a white light source is supplemented with light generated by a supplemental light source, such as one or more chromatic light emitting diodes (LEDs). The supplemental light source generates chromatic and/or white light that is mixed with the white light generated by the white light source. In this manner, the resulting light comprises a combination of the white light and the supplemental light. By adjusting the relative contributions of the white light source and the supplemental light source, one or more properties of the resulting light can be adjusted. For example, it may be desired that the generated light comprise a particular color temperature. In this case, feedback on the actual color temperature can be used to make any necessary adjustments to the white light source and/or supplemental light source to obtain/maintain the desired color temperature. As a result, the invention provides a white light emitting device that can be incorporated into various lighting applications, and has an extended life for emitting usable white light.

A first aspect of the invention provides a device for generating light, the device comprising: a phosphor-conversion white light emitting diode (LED); and a first supplemental LED, wherein the light generated by the device comprises a combination of the light produced by the white LED and the first supplemental LED.

A second aspect of the invention provides a method of generating light, the method comprising: producing white light using a phosphor-conversion light emitting diode (LED); producing a first supplemental light using a first supplemental LED, wherein the first supplemental light has a first chromatic wavelength; and combining the white light and the first supplemental light.

A third aspect of the invention provides a device for generating light, the device comprising: a white light source; a first supplemental light emitting diode (LED) that produces cyan light; and a second supplemental LED that produces red light, wherein the light emitted from the device comprises a combination of the light produced by the white light source, the first supplemental LED, and the second supplemental LED.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which:

FIG. 4A shows general CRI and a minimum value of fourteen special CRIs plotted as a function of color temperature for light generated by one embodiment of the invention;

FIG. 4B shows luminous efficiency plotted as a function of color temperature for light generated by one embodiment of the invention;

FIG. 4C shows the relative power of light devices plotted as a function of color temperature for light generated by one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the invention provides a method and device for generating white light. In particular, a white light source is supplemented with light generated by a supplemental light source, such as one or more chromatic light emitting diodes (LEDs). It is understood that, as used herein, the term "white light" comprises light having sufficient radiance in various wavelengths so as to be perceived as "white." Further, the term "chromatic light," as used herein comprises light that is perceived as having a particular non-white color (e.g., red, blue, yellow, etc.). In any event, the supplemental light source generates chromatic and/or white light that is mixed with the white light generated by the white light source. In this manner, the resulting light comprises a combination of the white light and the supplemental light. By adjusting the relative contributions of the white light source and the supplemental light source, one or more properties of the resulting light can be adjusted. For example, it may be desired that the generated light comprise a particular color temperature. In this case, feedback on the actual color temperature can be used to make any necessary adjustments to the white light source and/or supplemental light source to obtain/maintain the desired color temperature. As a result, the invention provides a white light emitting device that can be incorporated into various lighting applications, and has an extended life for emitting usable white light.

Figure 1:
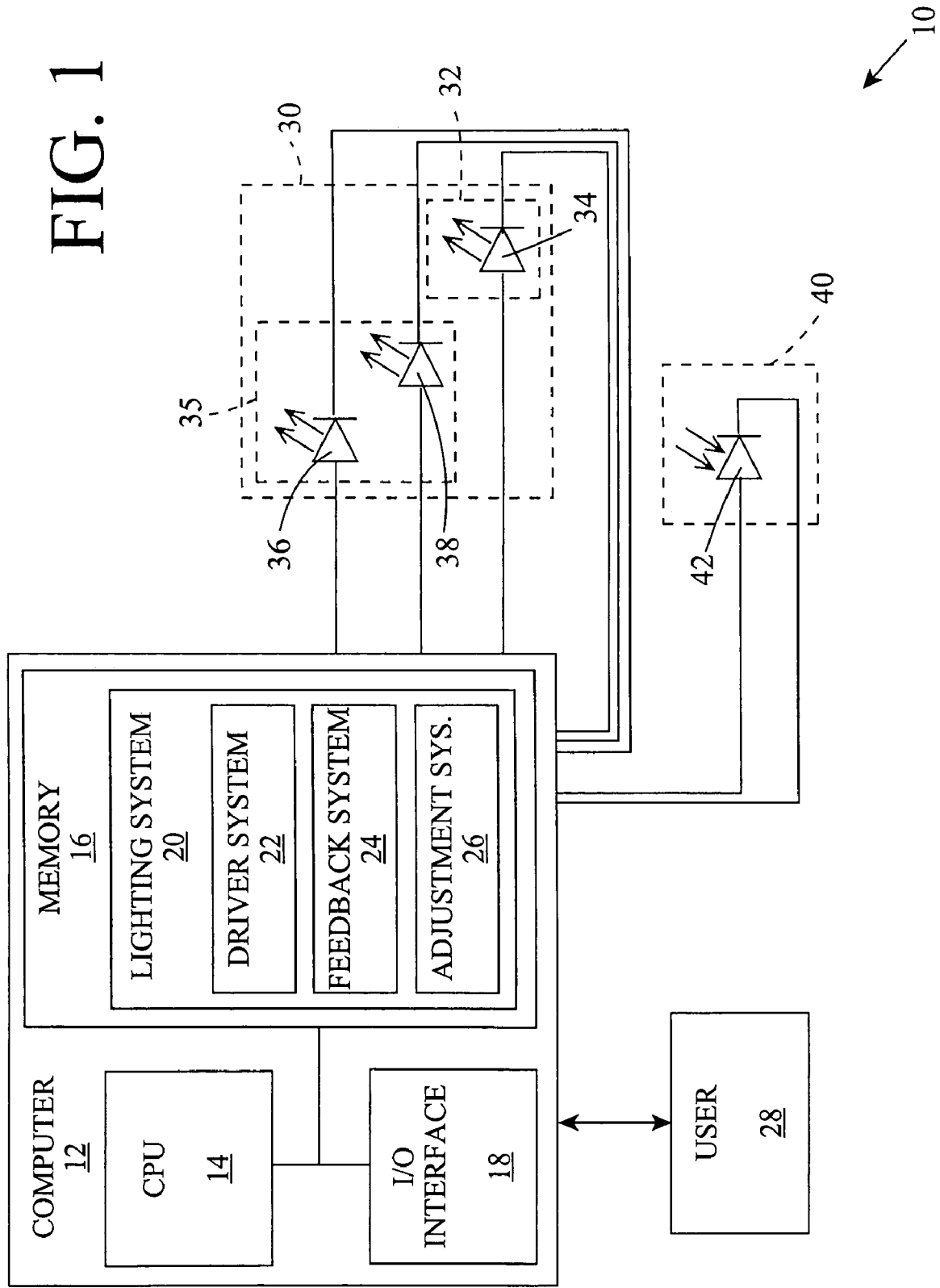
FIG. 1 shows an illustrative device for generating light according to one embodiment of the invention.

Turning to the drawings, FIG. 1 shows an illustrative device 10 for generating white light. Device 10 is shown including a computer 12, a light generation system 30, and a light detection system 40. In general, computer 12 can operate light sources in light generation system 30 to generate white light. Further, computer 12 can obtain data on the generated light from light detection system 40, and adjust the operation of light generation system 30 so that the generated light comprises one or more desired properties. It is understood, however, that computer 12 and/or light detection system 40 may not be included in various embodiments of the invention.

Computer 12 can comprise any type of computing device. To this extent, computer 12 is shown including a central processing unit (CPU) 14, a memory 16, and an input/output (I/O) interface 18. As is known in the art, CPU 14 performs operations based on computer program instructions and/or data stored in memory 16. I/O interface 18 provides an interface for transferring data between computer 12 and one or more external devices, such as light generation system 30 and light detection system 40, and/or a user 28. Computer 12 can comprise a general purpose computing device, a specific use computing device, or some combination thereof.

Computer 12 is shown including a lighting system 20 stored in memory 16. Lighting system 20 can comprise computer program code that operates light generation system 30 and/or light detection system 40. To this extent, lighting system 20 is shown including a driver system 22, a feedback system 24, and an adjustment system 26. In general, driver system 22 operates the various light sources in light generation system 30, feedback system 24 obtains light data from light detection system 40, and adjustment system 26 determines whether any adjustments should be made to the operation of light generation system 30 based on, for example, the feedback and/or input from user 28. Operation of each of these systems will be discussed further below.

It is understood that lighting system 20 and/or the various systems shown included therein can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the respective methods described herein. Alternatively, a specific use computer (e.g., a finite state machine), containing specialized hardware for carrying out one or more of the functional tasks of the invention, could be utilized. Lighting system 20 and/or the various systems shown included therein can also be embedded in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

As shown in FIG. 1, light generation system 30 includes at least one white light source 32. White light source 32 can comprise any type of device capable of generating white light. For example, white light source 32 can comprise one or more of a phosphor-conversion LED 34, an incandescent light bulb, a gas discharge tube, a fluorescent tube, or the like. Additionally, light generation system 30 includes a supplemental light source 35 that includes one or more supplemental LEDs 36, 38. Each supplemental LED 36, 38 can comprise any type of LED. For example, a supplemental LED 36, 38 could comprise a chromatic LED, a white LED, or the like. In operation, the white light generated by white light source 32 is combined with the light generated by supplemental light source 35 to produce the light generated by light generation system 30.

Various aspects of the invention will be further discussed with reference to an illustrative embodiment in which white light source 32 comprises a phosphor-conversion LED 34, and in which supplemental light source 35 comprises a cyan supplemental LED 36, and a red supplemental LED 38. It is understood, however, that this configuration is only illustrative, and various alternative lighting devices can be used as white light source 32 and/or supplemental light source 35. In any event, phosphor-conversion LED 34 can comprise a blue InGaN diode that has a portion of its emitted light converted to yellow by a phosphor. In this case, phosphor-conversion LED 34 can generate light in a broad emission spectrum in the yellow-green region. Further, cyan supplemental LED 36 can comprise an InGaN LED, and red supplemental LED 38 can comprise an AlInGaP LED. In operation, the light generated by light generation system 30 comprises a combination of the light generated by phosphor-conversion LED 34, cyan supplemental LED 36, and/or red supplemental LED 38.

Figure 2:
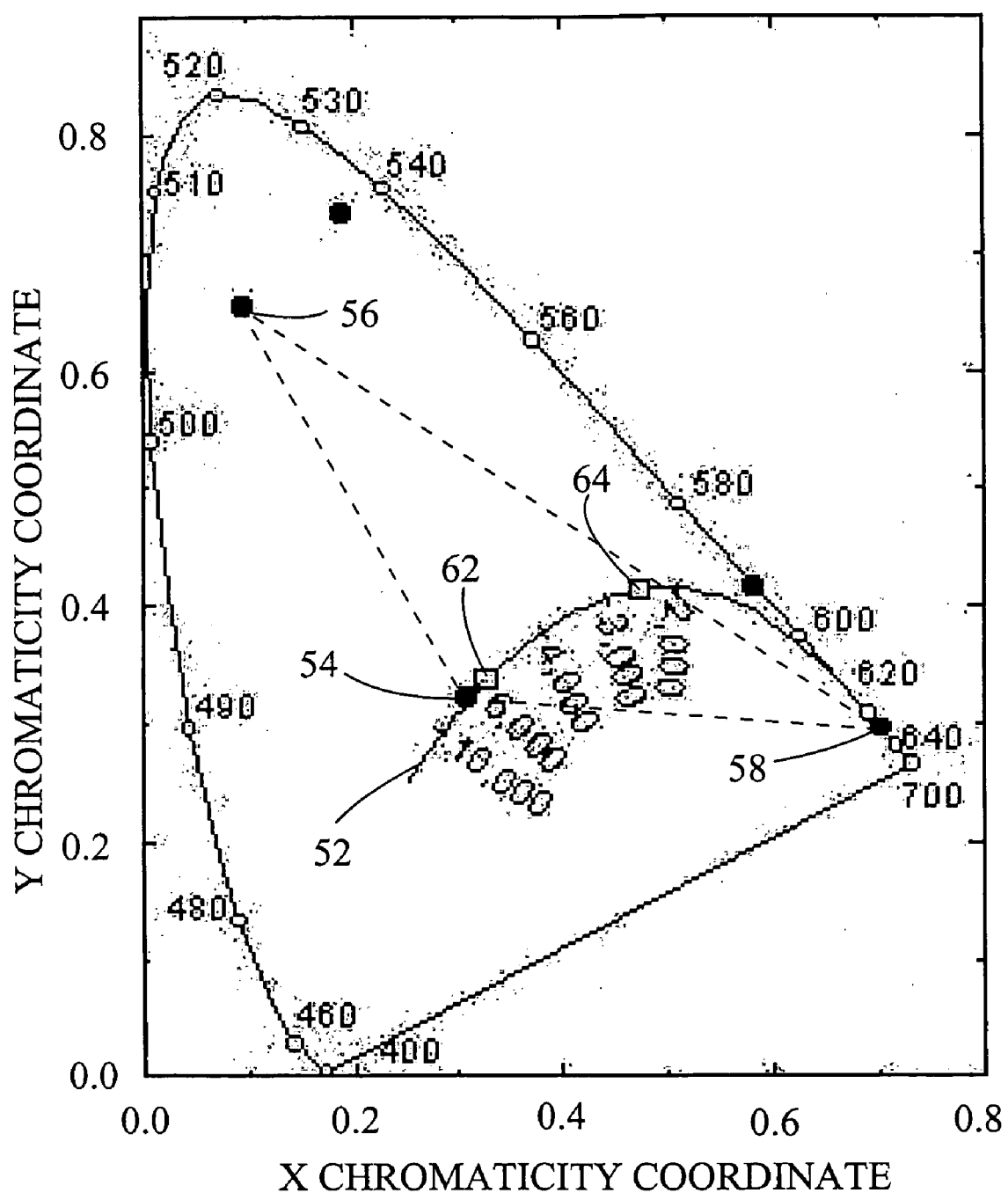
FIG. 2 comprises a 1931 CIE chromaticity diagram illustrating light generated by one embodiment of the invention.

FIG. 2 shows a 1931 International Commission on Illumination (CIE) chromaticity diagram 50 that includes x and y chromaticity points for various color wavelengths (clear points). Further, the chromaticity diagram includes a blackbody radiator locus 52 that defines the color "white" as starting at a color temperature of approximately 2500 K. Chromaticity diagram 50 also includes the chromaticity points for light generated by several illustrative light sources (filled points), including each of the light sources in the illustrative embodiment. In particular, white light 54 corresponds to the light generated by phosphor-conversion LED 34 (FIG. 1). White light 54 matches blackbody radiator locus 52 at a color temperature of approximately 6725 Kelvin (K). Additionally, cyan light 56 corresponds to the light generated by cyan supplemental LED 36 (FIG. 1), and red light 58 corresponds to the light generated by red supplemental LED 38 (FIG. 1).

As discussed above, light generation system 30 (FIG. 1) generates light that is a combination of white light source 32 (FIG. 1) and supplemental light source 35 (FIG. 1). The range of available chromaticity points for the light generated by light generation system 30 can be shown on chromaticity diagram 50. For example, when a single supplemental LED is used in conjunction with white light source 32, the range of available chromaticity points can be indicated on chromaticity diagram 50 by connecting the two chromaticity points with a straight line. In the illustrative embodiment in which supplemental light source 35 comprises two supplemental LEDs 36, 38 (FIG. 1), the range of available chromaticity points can be shown by a triangle that connects the three chromaticity points. As shown, the illustrative embodiment can generate light anywhere along blackbody radiator locus 52 having a color temperature that ranges from approximately 2325 K (only cyan light 56 and red light 58) to 6725 K (only white light 54). As a result, nearly the entire range of relevant chromaticities of white light can be generated using this combination, including, standard chromaticities of a tungsten lamp (2856 K), direct sunlight (4870 K), and daylight (6504 K).

Figure 3:
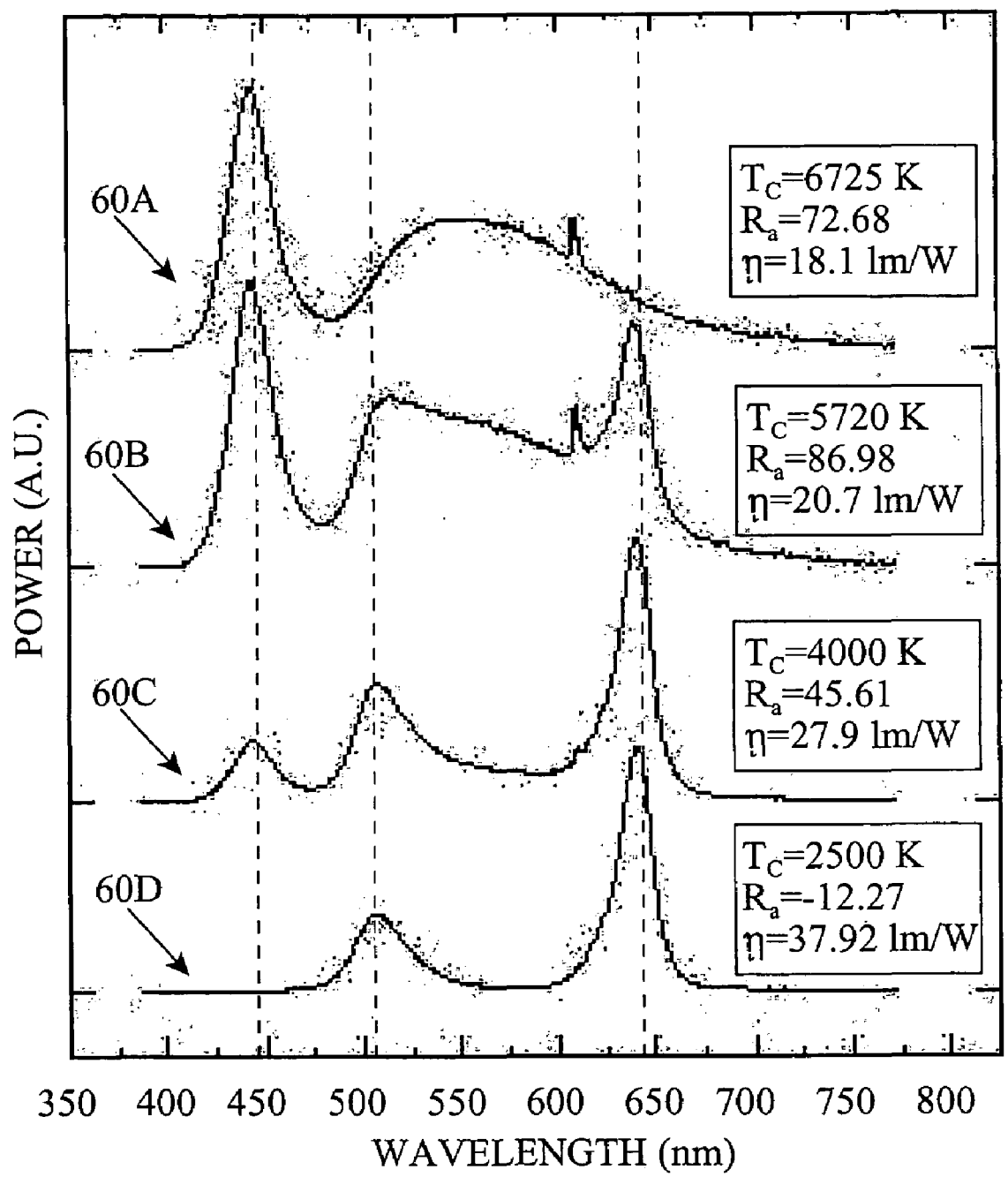
FIG. 3 shows characteristic spectral power distributions corresponding to four different color temperatures for light generated by one embodiment of the invention.

FIG. 3 shows characteristic spectral power distributions 60A–D corresponding to four different color temperatures, 6725 K, 5720 K, 4000 K, and 2500 K, respectively, for white light generated by the illustrative light generation system 30 (FIG. 1). Spectrum 60A corresponds to white light generated solely by phosphor-conversion LED 34 (FIG. 1). As a result, spectrum 60A includes a narrow line peaked at approximately 444 nm (blue), and a broad feature peaked at approximately 556 nm (yellow). In contrast, spectrum 60D comprises white light generated primarily by supplemental LEDs 36, 38 (FIG. 1) with a small mixture of white light from phosphor-conversion LED 34. As a result, spectrum 60D includes two narrow lines, one peaked at approximately 506 nm due to the emission from cyan supplemental LED 36 (FIG. 1), and the other peaked at approximately 641 nm due to the emission from red supplemental LED 38 (FIG. 1). Spectrums 60B–C represent more of a mix of light generated by phosphor-conversion LED 34, and supplemental LEDs 36, 38.

The general color rendering index (CRI) and luminous efficiency are also indicated for each spectrum 60A–D. As shown, the illustrative light generation system 30 (FIG. 1) provides the best color rendering (approximately 87) when the generated light corresponds to spectrum 60B. The color temperature for spectrum 60B was approximately 5720 K, and is indicated in FIG. 2 by point 62. However, the illustrative light generation system 30 generates the most efficient white light (approximately 38 Lamberts/Watt (lm/W)) when the generated light corresponds to spectrum 60D. The color temperature for spectrum 60D was approximately 2500 K, and is indicated in FIG. 2 by point 64. As illustrated by spectrum 60C, for color temperatures between points 62, 64, color rendering and luminous efficiency have an inverse relationship.

FIGS. 4A–C illustrate various properties of white light generated by the illustrative light generation system 30 (FIG. 1) as a function of color temperature. In FIG. 4A, both the general CRI (filled points) and a minimum value of fourteen special CRIs are plotted as a function of color temperature. The general CRI is frequently used to analyze broad-band spectra generated by fluorescent lamps and the like. However, when applied to devices that include narrow lines such as the illustrative light generation system 30, the general CRI has been criticized as providing an incomplete measure. As a result, the general CRI is supplemented with fourteen special CRIs, each representing a particular color.

As can be seen in FIG. 4A, both the general CRI and the minimum special CRI peak at approximately the same color temperature of 5725 K. At this color temperature, the general CRI attains a value of approximately 87 points, while the minimum special CRI has a value of approximately 77 points. At the minimum and maximum values for white color temperatures generated by the illustrative light generation system 30, the general CRI values drop to −18 points (2500 K) and 73 points (6725 K), and the minimum special CRI values drop to −210 points (2500 K, not shown) and −12 points (6725 K).

Figure 5:
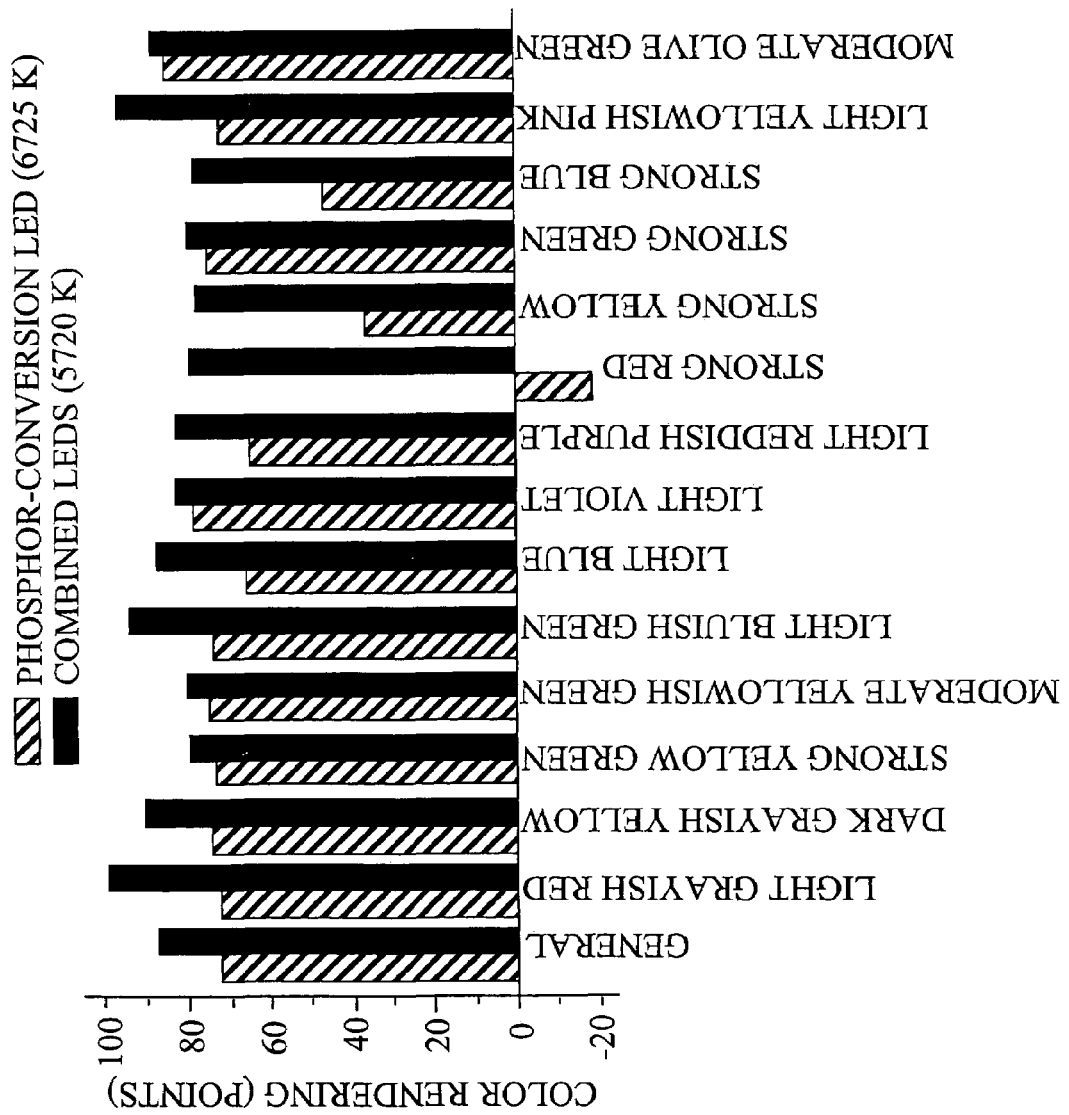
FIG. 5 compares general CRI and fourteen special CRIs for light generated by a phosphor-conversion LED alone, and supplemented according to one embodiment of the invention.

FIG. 5 shows a breakdown of the general CRI and special CRI values for the illustrative phosphor-conversion LED 34 (FIG. 1), and the phosphor-conversion LED 34 supplemented by cyan supplemental LED 36 (FIG. 1) and red supplemental LED 38 (FIG. 1). As discussed previously, phosphor-conversion LED 34 generates white light having a color temperature of approximately 6725 K, and a spectrum 60A as shown in FIG. 3. When supplemented with cyan supplemental LEDs 36, 38 to a color temperature of approximately 5720 K, the illustrative light generation device 30 (FIG. 1) generates a spectrum 60B as shown in FIG. 3. FIG. 5 clearly illustrates that the general CRI value and each special CRI value improved when the supplemented light was used. Further, significant improvement of the special CRI values for strong red, strong yellow, and strong blue were obtained when the supplemented light was used. For each of these special CRI values, the performance improved from poor for phosphor-conversion LED 34 alone to generally acceptable for the supplemented light.

FIG. 4B shows a plot of luminous efficiency of the illustrative light generation system 30 (FIG. 1) as a function of color temperature. As can be seen, luminous efficiency steadily declines as the color temperature increases. At a color temperature of approximately 5270 K, at which the best color rendering was obtained as discussed above, the luminous efficiency is approximately 21 lm/W. This value is somewhat higher than the luminous efficiency of approximately 18 lm/W for phosphor-conversion LED 34 (FIG. 1). By further decreasing the color temperature, the luminous efficiency approaches approximately 38 lm/W for white light having a color temperature of approximately 2500 K. As indicated in FIG. 4A, the increased luminous efficiency obtained with the lower color temperatures comes with decreased color rendering. However, this implies that light generation system 30 can generate white light having an adjustable tradeoff between color rendering and luminous efficiency. For example, light generation system 30 could be used in an environment in which illumination alternates between "social" lighting, where a high color rendering is desired, and a safety/orientation lighting, where high efficiency is more desirable.

FIG. 4C shows a plot of the relative power contributions of phosphor-conversion LED 34 (FIG. 1), cyan supplemental LED 36 (FIG. 1), and red supplemental LED 38 (FIG. 1) as a function of color temperature. For a color temperature of approximately 5720 K, which provides the best color rendering, the relative power contributions for phosphor-conversion LED 34, cyan supplemental LED 36, and red supplemental LED 38 can comprise approximately 87, 7.5, and 5.5, respectively. For a color temperature of approximately 2500 K, the most efficient white light, the relative power contributions can comprise approximately 5.5, 61, and 33.5, respectively.

Returning to FIG. 1, driver system 22 can provide the appropriate driving current to each device in light generation system 30. For example, driver system 22 can alter the respective driving currents for phosphor-conversion LED 34, cyan supplemental LED 36, and red supplemental LED 38 so that light generation system 30 generates light having a desired color temperature, luminous efficiency, color rendering, etc. In one embodiment, driver system 22 can alter the driving current for a particular device by altering a width of a driving pulse for the driving current (e.g., pulse-width modulation).

Driver system 22 provides device 10 with the ability to selectively control the light generated by light generation system 30. To this extent, adjustment system 26 can adjust one or more properties of the light generated by light generation system 30. For example, adjustment system 26 can instruct driver system 22 to alter the relative power contributions of the devices in light generation system 30 to change between "social" lighting and "safety" lighting. In this case, the relative power contributions for "social" lighting could be set to provide a high color rendering, while the relative power contributions for "safety" lighting could be set to provide white light efficiently. Other properties such as luminous flux, color temperature, and the like can be adjusted in a similar manner.

Adjustment system 26 can adjust the light generated by light generation system 30 based on input from user 28 and/or feedback obtained by feedback system 24. Feedback system 24 can obtain light data on the light generated by light generation system 30 from light detection system 40. In particular, light detection system 40 can include a photo-diode 42 that provides light data on color temperature, luminous flux, or the like to feedback system 24. Further, light detection system 40 can obtain light data on a general CRI value and/or one or more special CRI values from light detection system 40 and/or user 28.

In any event, feedback system 24 can determine if the light generated by light generation system 30 comprises one or more of the desired properties. If a property of the generated light differs from the desired property, then feedback system 24 can provide this information to adjustment system 26, which can determine the appropriate adjustments to be made by driver system 22. For example, feedback system 24 can ensure that light generated by light generation system 30 comprises a particular color temperature (e.g., 5720 K). As one or more devices in light generation system 30 ages and/or heats during use, the actual color temperature of the light generated by light generation system 30 may change without any changes by driver system 22. In this case, feedback system 24 can detect the change in color temperature, and an adjustment can be made to driver system 22 in order to correct the generated light.

The foregoing description of various embodiments of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A device for generating light, the device comprising:
a white light emitting diode (LED);
a first supplemental LED that produces cyan light; and
a second supplemental LED that produces red light, wherein the light generated by the device comprises a combination of the light produced by the white LED, the first supplemental LED, and the second supplemental LED.

2. The device of claim 1, wherein the cyan light comprises a chromatic wavelength of approximately 506 nanometers and the red light comprises a chromatic wavelength of approximately 641 nanometers.

3. The device of claim 1, wherein the light produced by the white LED comprises a color temperature of approximately 6725 K.

4. The device of claim 1, further comprising an adjustment system for adjusting at least one property of the generated light.

5. The device of claim 4, wherein the at least one property comprises at least one of: a color temperature, an efficiency, a luminous flux, and a color rendering.

6. The device of claim 4, wherein the adjustment system includes a computer program product comprising a computer useable medium having computer readable program code embodied therein for automatically adjusting the at least one property of the generated light.

7. The device of claim 4, further comprising a feedback system for obtaining feedback on at least one of: a color temperature, a luminous flux, and a color rendering for the generated light, wherein the adjusted at least one property of the generated light is based on the feedback.

8. The device of claim 1, further comprising a driver system for providing a driving current to at least one of: the white LED, the first supplemental LED, and the second supplemental LED.

9. The device of claim 8, wherein the driver system alters a width of a driving pulse for the driving current.

10. The device of claim 1, wherein the white LED comprises at least one of: a phosphor-conversion white LED or a multi-chip white LED.

11. A method of generating light, the method comprising:
producing white light using a white light emitting diode (LED);
producing a first supplemental light using a first supplemental LED that produces cyan light;
producing a second supplemental light using a second supplemental LED that produces red light; and
combining the white light, the first supplemental light, and the second supplemental light.

12. The method of claim 11, further comprising adjusting at least one property of the generated light.

13. The method of claim 12, wherein the adjusting step includes altering a driving current of at least one of: the white LED and the first supplemental LED.

14. The method of claim 12, wherein the at least one property comprises at least one of: a color temperature, an efficiency, a luminous flux, and a color rendering.

15. The method of claim 11, further comprising obtaining feedback based on the generated light.

16. A device for generating light, the device comprising:
a white light source;
a first supplemental light emitting diode (LED) that produces cyan light; and
a second supplemental LED tat produces red light, wherein the light emitted from the device comprises a combination of the light produced by the white light source, the first supplemental LED, and the second supplemental LED.

17. The device of claim 16, wherein the white light source comprises at least one of: a phosphor-conversion LED, an incandescent light bulb, a gas discharge tube, and a fluorescent tube.

18. The device of claim 16, further comprising a driver system for altering a driving current of at least one of: the white light source, the first supplemental LED, and the second supplemental LED.

19. The device of claim 16, further comprising a feedback system for obtaining feedback on at least one of: a color temperature, a luminous flux, and a color rendering index for the generated light.

20. The device of claim 16, further comprising an adjustment system for adjusting at least one property of the generated light.

* * * * *